United States Patent
Gee et al.

(10) Patent No.: US 6,320,617 B1
(45) Date of Patent: *Nov. 20, 2001

(54) CMOS ACTIVE PIXEL SENSOR USING A PINNED PHOTO DIODE

(75) Inventors: Russell Clayton Gee, Santa Clara, CA (US); Paul Poo-Kam Lee, Pittsford; Teh-Hsuang Lee, Webster, both of NY (US); Eric R. Fossum, La Crescenta, CA (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/742,002

(22) Filed: Oct. 31, 1996

Related U.S. Application Data (60) Provisional application No. 60/006,261, filed on Nov. 7, 1995.

(51) Int. Cl.[7] .................................................. H04N 3/14
(52) U.S. Cl. ............................................ 348/302; 348/308
(58) Field of Search .................................... 348/302, 304, 348/308; 257/79, 80, 82, 292, 293, 294, 291, 290

(56) References Cited

U.S. PATENT DOCUMENTS

| | | | |
|---|---|---|---|
| 3,822,362 | * | 7/1974 | Weckler et al. ........................ 348/294 |
| 4,333,111 | | 6/1982 | Noda et al. ............................ 358/213 |

(List continued on next page.)

FOREIGN PATENT DOCUMENTS

| | | | |
|---|---|---|---|
| 62-160750 | 7/1987 | (JP) | ................................ H01L/27/04 |
| 03-161964 | 7/1991 | (JP) | ................................ H01L/27/06 |
| 63-299268 | 12/1988 | (JP) | ................................ H01L/27/14 |
| 61-125081 | 6/1986 | (JP) | ................................ H01L/29/76 |
| 01-135184 | 5/1989 | (JP) | ................................ H04N/5/335 |

OTHER PUBLICATIONS

"Progress in CMOS Active Pixel Image Sensesors"; Mardis, Sunetra; Kenemy; Sabrina E; Gee, Russel C.; Pain, Bedabrata; Kim; Quiesup; Fossum; SPIE vol. 2172.*

"CMOS Active Pixel Image Sensor" by mendis, et al., IEEE Transactions on Electron Devices, vol. 41, No. 3, Mar. 1994, pp. 452–453.

(List continued on next page.)

*Primary Examiner*—Wendy R. Garber
*Assistant Examiner*—Jacqueline Wilson
(74) *Attorney, Agent, or Firm*—Peyton C. Watkins (57) ABSTRACT

Circuit architecture of an x-y addressable image sensor, in particular to that of a Complementary Metal Oxide Semiconductor (CMOS) active pixel sensor (APS). A substrate having an area divided into a plurality of pixel areas arranged in a series of rows and columns, having at least one control area separate from the pixel areas; a pinned photodiode formed in at least one of the pixel areas of the substrate; a readout transistor integrated on the pixel area of the substrate and operatively coupled to the pinned photodiode through a transfer gate and a charge to voltage converter; a row selection circuit having at least one selection transistor integrated on the substrate in the area for selecting the pixel area; a column selection circuit for selecting a group of pixels, the selection circuit formed in one of the control areas separate from the pixel areas, the selection circuit further comprising a column readout circuit including a double delta sampling circuit formed from a process that is compatible with CMOS technology; and a reset mechanism for resetting the floating diffusion. The present invention further comprises the use of overlapping gates to reduce the overall size requirements.

24 Claims, 7 Drawing Sheets

U.S. PATENT DOCUMENTS

| | | | |
|---|---|---|---|
| 4,413,284 | 11/1983 | Izumita et al. | 358/213 |
| 4,484,210 | 11/1984 | Shiraki et al. | 357/24 |
| 4,809,075 | 2/1989 | Akimoto et al. | 358/213.18 |
| 4,908,518 | 3/1990 | Losee et al. | 358/213.23 |
| 4,984,047 | 1/1991 | Stevens | 357/30 |
| 5,051,797 | 9/1991 | Erhardt | 357/24 |
| 5,060,245 | 10/1991 | Nelson | 377/60 |
| 5,115,458 | 5/1992 | Burkey et al. | 377/58 |
| 5,182,623 | 1/1993 | Hynecek | 257/230 |
| 5,235,196 | 8/1993 | Anagnostopoulos et al. | 257/223 |
| 5,235,198 | 8/1993 | Stevens et al. | 257/232 |
| 5,256,891 | 10/1993 | Losee et al. | 257/233 |
| 5,306,931 | 4/1994 | Stevens | 257/223 |
| 5,337,340 | 8/1994 | Hyneck | 377/60 |
| 5,359,213 | 10/1994 | Lee et al. | 257/223 |
| 5,471,515 * | 11/1995 | Fossum et al. | 377/60 |
| 5,486,711 * | 1/1996 | Ishida | 257/258 |
| 5,541,654 * | 7/1996 | Roberts | 348/302 |
| 5,614,744 * | 3/1997 | Merrill | 257/291 |
| 5,625,210 * | 4/1997 | Lee et al. | 257/292 |
| 5,708,471 * | 1/1998 | Okumura | 348/301 |
| 5,751,189 * | 5/1998 | Shyu et al. | 330/9 |
| 5,751,643 * | 5/1998 | Lins | 365/189.11 |
| 5,901,083 * | 5/1999 | Atsumi et al. | 365/185.11 |

OTHER PUBLICATIONS

"The Pinned Photodiode For An Interline–Transfer CCD Image Sensor" by Burkey, et al., IEDM84, 1984, pp. 28–31.

"Amplified MOS Intelligent Images" by Andoh, et al., J.I.T.E. of Japan, vol. 41, Nov. 1987.

IEEE Tranasactions on Electron Devices, May 1991, vol. 38, No. 5, "The Operation Mechanism of a Change Modulation Device (CMD) Image Sensor," K. Matsumoto, et al., pp. 989–990.

IEEE Transactions on Electron Devices, May 1991, vol. 38, No. 5, "Analysis of Operational Speed and Scaling Down the Pixel Size of a Charge Modulation Device (CMD) Image Sensor," by K. Matsumoto, et al., pp. 999–1004.

IEEE Transactions on Electron Devices, May 1991, vol. 38, No. 5, "A Small Pixel CMD Image Sensor," by M. Ogata, et al., pp. 1005–1010.

IEEE Transactions on Electron Devices, May 1991, vol. 38, No. 5, "BCMD–An Improved Photosite Structure for High–Density Image Sensors," by J. Hynecek, pp. 1011–1020.

IEEE Transactions on Electron Devices, May 1991, vol. 38, No. 5, "A 250 k–Pixel SIT Image Sensor Operating in its High–sensitivity Mode," by T. Mizoguchi, et al., pp. 1021–1027.

IEEE Transactions on Electron Devices, May 1991, vol. 38, No. 5, "Design of Bipolar Imaging Device (BASIS)," by Y. Nakamura, et al., pp. 1028–1036.

IEEE Transactions on Electron Devices, May 1991, vol. 38, No. 5, "REduction of Fixed–Pattern Noise of BASIS Due to Low Kinetic Energy Reactive Ion and Native–Oxide–Free Processing," by M. Miyawaki, et al., pp. 1037–1043.

IEEE Transactions on Electron Devices, May 1991, vol. 38, No. 5, "A High–Sensitivity MOS Photo–Transistor for Area Image Sensor," by Y. Matsunaga, et al., pp. 1044–1047.

* cited by examiner

CMOS ACTIVE PIXEL SENSOR USING A PINNED PHOTO DIODE

CROSS REFERENCE TO RELATED APPLICATION:

Reference is made to and priority claimed from U.S. Provisional Application Serial No. 60/006,261, filed Nov. 7, 1995, entitled A CMOS ACTIVE PIXEL SENSOR USING A PINNED PHOTODIODE.

BACKGROUND OF THE INVENTION

1. Field of the Invention

The invention relates generally to the field of active pixel sensors, and more particularly to the architecture control circuits for active pixel sensors. More specifically, the invention relates to CMOS control circuits for active pixel sensors.

2. Description of the pior Art

Prior art active pixel sensors made from a CMOS process have used source/drain implants to form a photodiode, and polysilicon to form photogates as the light sensing elements. These light sensing elements have suffered from poor quantum efficiency, lag, and noise.

In order to overcome these problems, integration of a pinned photodiode in an active pixel sensor light sensing element was disclosed by Lee et al in U.S. Patent Application No. 08/421,173 to facilitate a pinned photo diode light sensing element within the architecture of an active pixel sensor. There is a shortcoming within this prior art device in that it does not show the manner in which the pixels are controlled by the control circuitry.

Prior art devices have numerous problems in integrating a camera system on a chip using CMOS process technology. These problems include column fixed pattern noise and the inability to fit the selection circuitry with the corresponding output amplifiers into a desired pixel pitch.

As can be seen by the foregoing discussion, there remains a need within the art for a method and apparatus of incorporating a pinned photodiode based image sensor within a CMOS device to alleviate fixed pattern noise, reduce the overall size of the device to achieve the desired pixel pitch, and to provide for a means to compensate for threshold voltage variation.

SUMMARY OF THE INVENTION

The present invention is directed to overcoming one or more of the problems set forth above. This invention relates to the circuit architecture of an x-y addressable image sensor, in particular to that of a Complementary Metal Oxide Semiconductor (CMOS) active pixel sensor (APS) array. The invention describes elements of circuits and their embodiments to operate an APS which has a Pinned Photo Diode as its image sensing element.

An active pixel sensor incorporating a pinned photo diode offers advantages over conventional photogate or photodiode based APS by having high quantum efficiency, low dark current, no image lag, and low reset noise. This invention summary describes the circuitry building blocks, architecture, and circuit elements used in building this sensor.

Briefly summarized, one aspect of the present invention, describes an active pixel sensor comprising: a substrate having an area divided into a plurality of pixel areas arranged in a series of row and columns, having at least one control area separate from the pixel areas; a pinned photodiode formed in at least one of the pixel areas of the substrate; a readout transistor integrated on the pixel area of the substrate and operatively coupled to the pinned photodiode through a transfer gate and a charge to voltage conversion means; at least one selection transistor integrated on the substrate that is capable of selecting one row of the pixel areas; a column selection circuit capable of selecting a group of pixels formed within the substrate in one of the control areas separate from the pixel areas, the selection circuit further comprising a column readout circuit including a double delta sampling circuit formed from a process that is compatible with CMOS technology; and a reset circuit. The present invention further comprises the use of overlapping gates to reduce the overall size requirements.

These and other aspects, objects, features, and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantages listed below:

Integrates the pinned photo diode light sensing element with specific control and readout circuitry to improve noise and spectral response characteristics;

Allows for integration of a camera system on a single chip using a CMOS process to provide reduced size and lower noise;

Provides a control and readout circuit having low noise with an active pixel sensor array having a pinned photodiode light sensing element; and Improves the fixed pattern noise characteristics of a CMOS active pixel sensor.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

This invention relates to the circuit architecture of an x-y addressable image sensor, in particular to that of a Complementary Metal Oxide Semiconductor (CMOS) active pixel sensor (APS) array. An example pixel array size of the present invention is 256×256 pixels and the overall chip size is 1.2×1.2 cm with a 40 pin pad frame. All of the row and column circuitry is designed with a 40 µm pitch to match the pixel size using a 2 micron design rule. The chip is designed to operate at 5 Volt CMOS voltage levels. Additional power supply voltages of 5, 2.5, and 1.25 Volt Direct Current power supplies may be used to enhance the performance.

Figure 1:
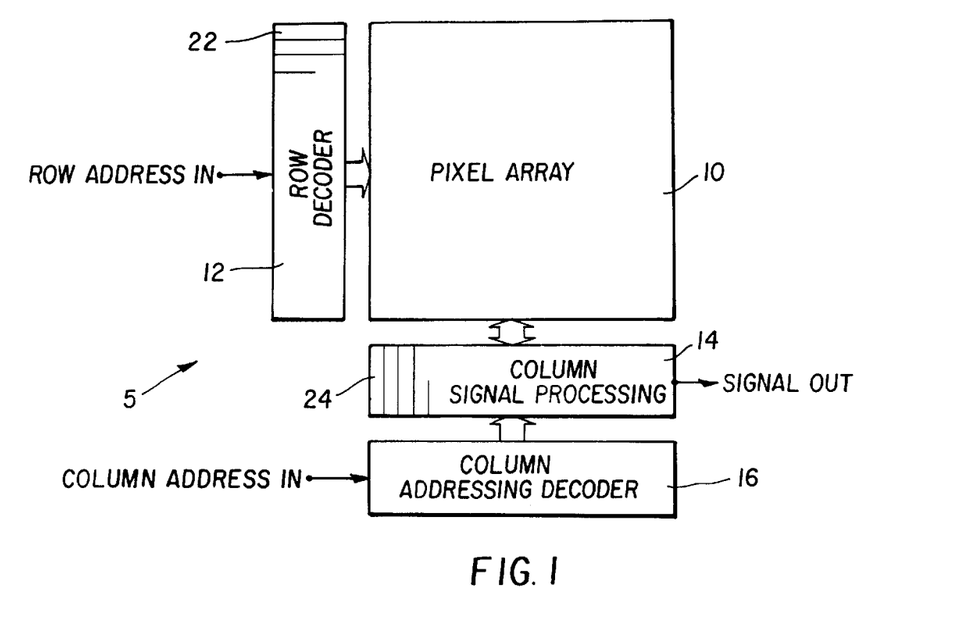
FIG. 1 shows the row and column addressing of a pixel array.

Referring to FIG. 1, which is a block diagram of an active pixel sensor as envisioned by the present invention. The active pixel sensor 5 comprises an array of pixels 10 that are arranged in rows and columns. The rows of the sensor 5 are provided with a global control logic block, generally referred to as row decoder 12 that has individual control circuits 22 for each of the rows within sensor 5. Global column addressing decoder 16 decodes column addresses for the column signal processing section 14 has individual control circuits 24 for each of the columns within sensor 5.

Figure 2:
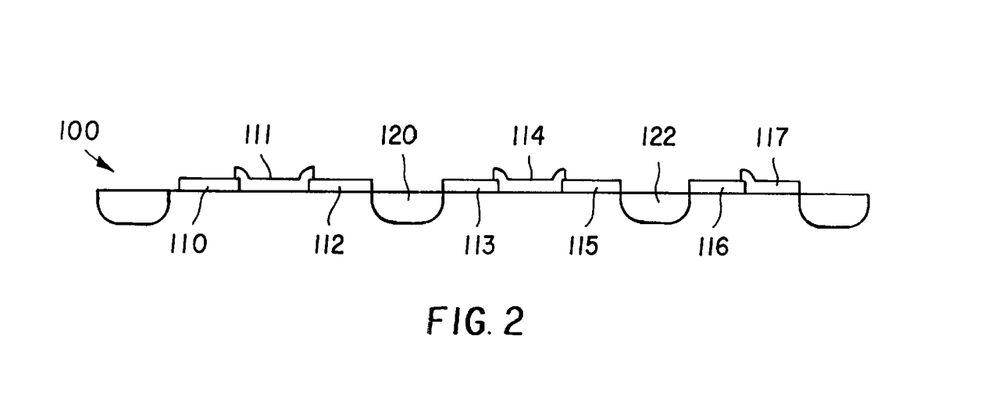
FIG. 2 shows a cross sectional view of eight transistors with overlapping polysilicon used to form a NAND gate.

Referring to FIG. 2, the row and column addressing of the 256×256 pixel array is preferably carried out using 8-input NAND gate 100, or the functional equivalent thereof. FIG. 2 shows the cross-section of the 8 n-channel transistors 110–117 in series to form the 8-input NAND gate 100. For row addressing, the inputs to n-channel transistors 110–117 are generally referred to as a0–a7, and for column addressing, the inputs to the n-channel transistors 110–117 are generally referred to as b0–b7.

The eight series n-channel transistors 110–117 in the 8-input NAND gate 100 were implemented using overlaid poly1-poly2 gates. As seen in FIG. 2, there is a diffusion 120 between the third gate 112 and the fourth gate 113, as well as diffusion 122 between the sixth gate 115 and seventh gate 116. These gates having diffusions 120, 122 between them are separated by a spacing of 2 µm to allow room for the diffusions 120, 122.

These transistors each have a gate length of 2 µm with 2 µm overlap of the poly1-poly2 gates of the adjacent transistors. Accordingly, the gate of transistor 110 overlaps gate 11 by 2 µm, for example. The center gate 111 is overlapped by 2 µm on each side, by gates 110, 112. This transistor formation, including overlapping poly gates, is similar to the formation that is used in charge coupled device (CCD) technology.

FIG. 2 shows the layout implementation of the 8 series n-channel transistors 110–117 with overlapping gates for the 8-bit NAND gate 100.

Figure 3:
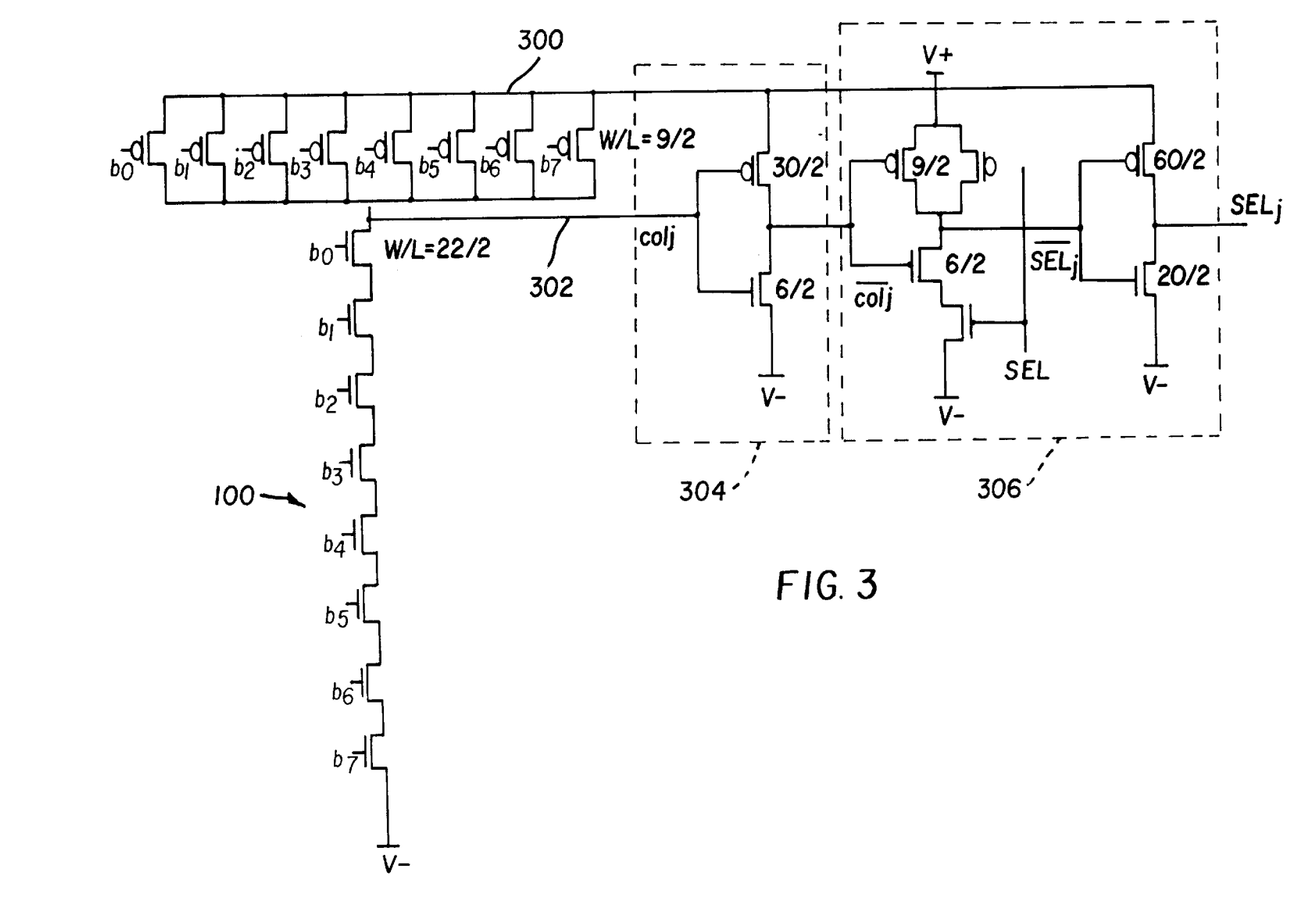
FIG. 3 shows a schematic of the column control logic of the present invention.

The schematic of the column control logic which generates the column selection signal $SEL_j$ is shown in FIG. 3. The column selection signal is used with the crowbar signal to perform the fixed pattern noise reduction operation. The column control logic also controls the serial readout of the data as will be explained.

Still referring to FIG. 3, a first bank of column selection transistors 300 are connected to create a negative input OR gate. If any of the column inputs ($b_0$ to $b_7$) are active (low), the corresponding transistor turns on and supplies V+ voltage to NAND gate 100. When all of the inputs $b_0$ to $b_7$ are inactive (high), an inactivity signal 302 is provided. This inactivity signal 302 is buffered by buffer circuit 304 and level adjusted and combined with the SEL signal by the level shifting AND gate circuit 306 to form the selection signals $SEL_j$, which are produced between pixel sampling interval. The SEL signal is used as described herein to reduce fixed pattern noise. OR gate 300 preferably uses transistors having a width to length ratio of 9/2, and a NAND gate 100 having a width to length ratio of 22/2.

Figure 4:
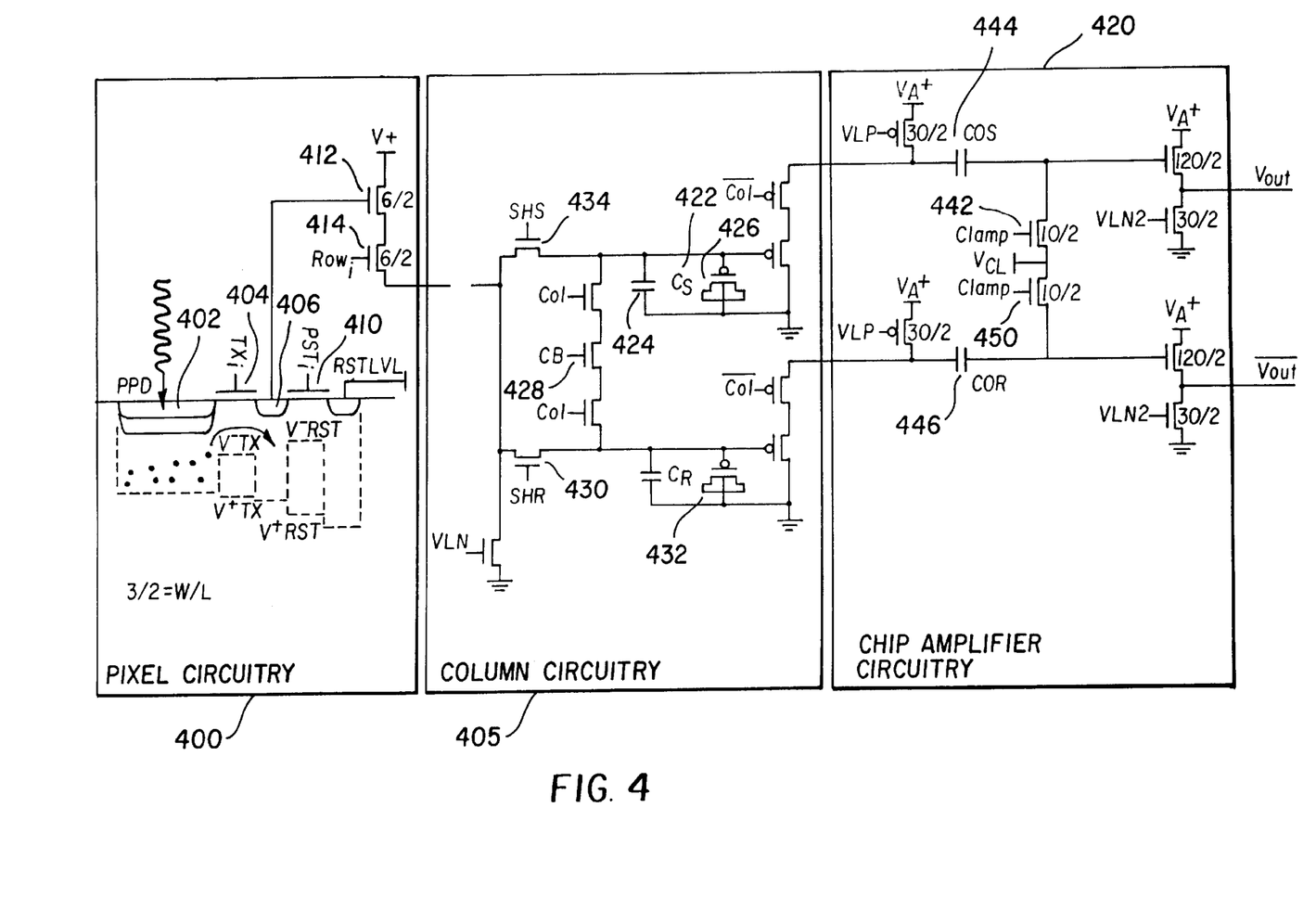
FIG. 4 shows a schematic of the row timing and control.

The column readout circuit is shown in FIG. 4. The elements within pixel region 400, are contained in each pixel of the array. Included within region 400 are pinned photodiode 402, transfer gate 404, and floating diffusion 406. The photodiode used herein, is preferably a pinned photodiode 402 which yields improved blue response and without image lag problems. The pinned photodiode 402 is preferably not overcoated by polysilicon or other interconnect material, thereby enhancing blue response.

Also included within region 400 is reset transistor 410 which operates to reset the floating diffusion 406 by clamping it to a zeroing voltage shown as V+. Source follower 412 receives and buffers the potential on floating diffusion 406.

Row decoder transistor 414 is turned on to enable the voltage on source follower 412 to be passed to the column processing circuitry.

The pinned photodiode 402 and the controlling devices, including gates and transistors, are preferably made with any technology that is compatible with CMOS, such as NMOS Elements to the left of common chip region 420, and to the right of region 400 are the column circuitry 405 provided for each column of pixels.

Column circuitry 405 includes stacked capacitors 422, each formed by a MOS capacitor 424 underneath a poly1-poly2 capacitor 426. This capacitor bank forms a high capacitance low kTC noise capacitor.

It is preferred that these devices also be made using a CMOS compatible process. Column circuitry 405 is used as the sample and hold capacitor to increase the capacitance and reduce the kTC noise on this capacitor.

In operation, the reset level of the floating diffusion is first sampled during any readout cycle by turning on the sample and hold reset transistor 430, to transfer the reset charge level on the floating diffusion to the reset capacitor bank 432. At the end of the light integration period, the photogenerated charge in the photodiode 402 is transferred by transfer gate 404 to floating diffusion 406. This photocharge adds to the reset level already present in the floating diffusion 406. The total is sampled by turning on the sample and hold transistor 434, thereby transferring the charge to capacitors 424 and 426. Each reset level for each pixel is subtracted from each signal level for the same pixel using off-chip circuitry. This correlation of the values effectively minimizes the Johnson noise within the pixel.

Crowbar switch 428 is used to reduce the fixed pattern noise by effecting a clamped reset.

This process is called "double delta sampling" (DDS). The crowbar switch 428 is activated at the same time the SEL signal is active, and selectively shorts the signal and reset level sample and hold capacitors 424, 426 together to reduce the fixed pattern noise generated by threshold voltage offsets in the p-channel column source followers. The signal and reset level of each pixel is read out, which allows for off-chip correlated double sampling (CDS) to reduce noise generated within each pixel The crowbar 428 is then released, and the reset and sample values are respectively applied to the capacitors 424, 426. Each of the sampled values that are applied to the capacitor effectively change the amount of charge on the capacitors. This change is measured. Since only the change is important in this circuit, the absolute threshold variations of the transistors are canceled out. This circuit and operation hence cancels the fixed pattern noise that would otherwise be generated by threshold voltage offsets in the p-channel column source followers.

Circuits to the right of dashed line LL, indicated as region 420, are common to the entire chip. These circuits are readout transistor devices and are also preferably CMOS compatible.

Figure 5:
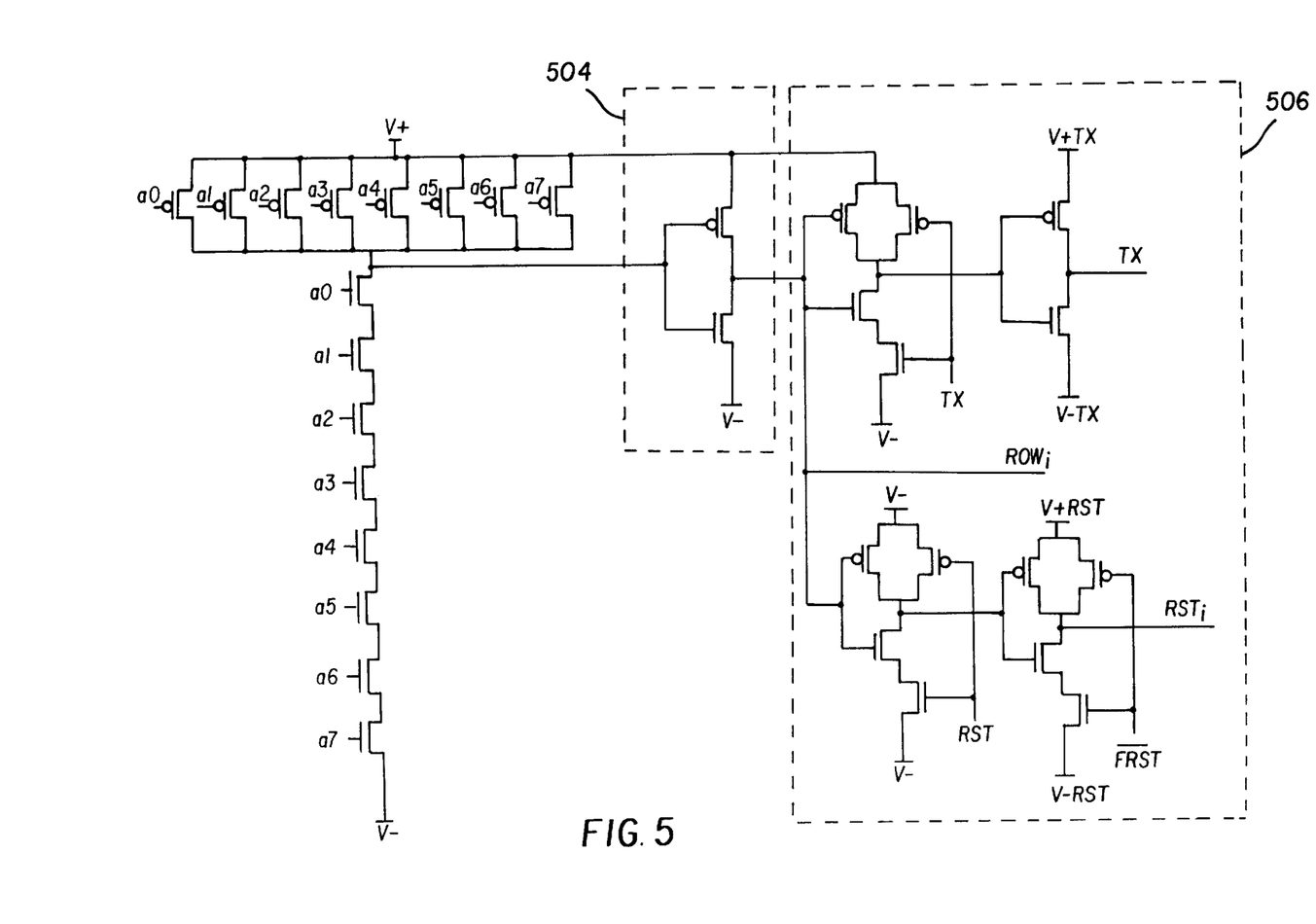
FIG. 5 shows a schematic of the row timing and control.
Figure 6:
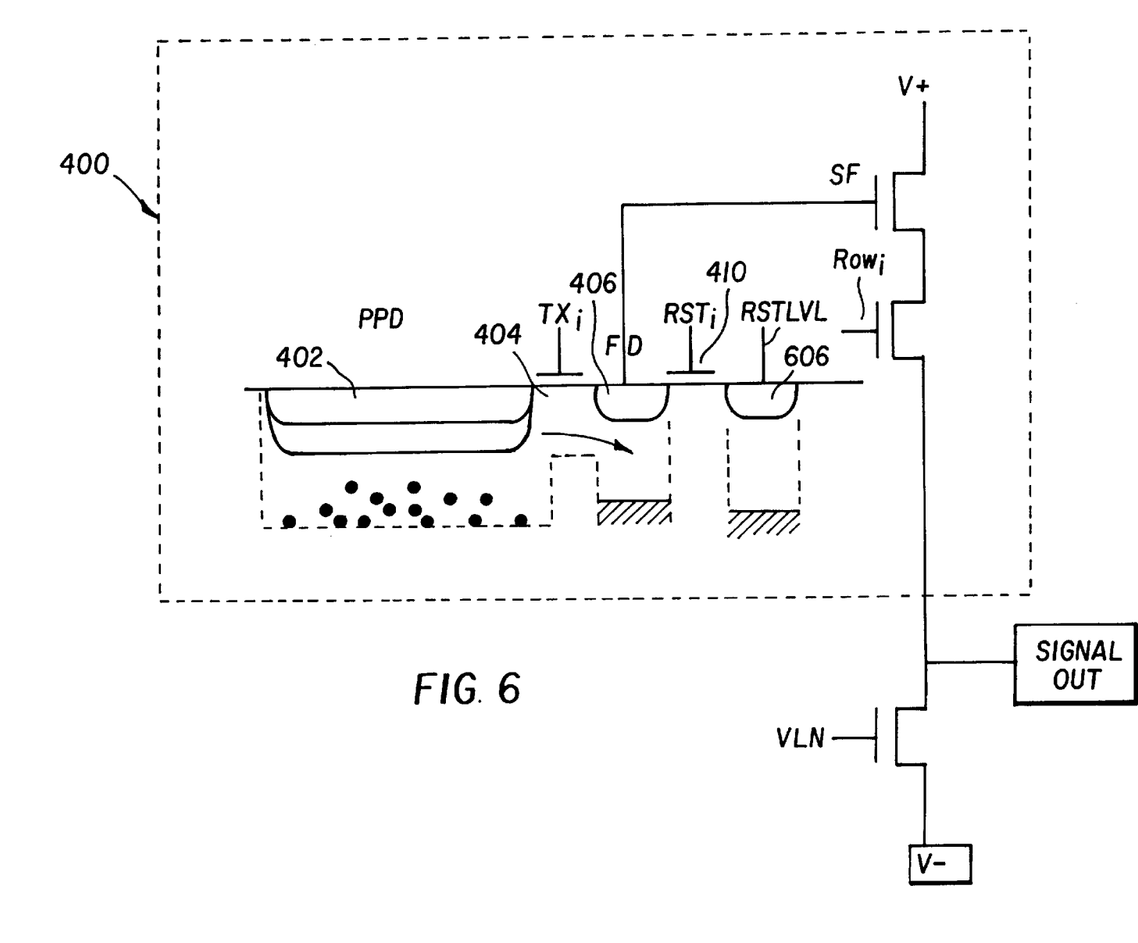
FIG. 6 shows a pinned photodiode APS pixel.

FIG. 5, seen in conjunction with FIGS. 1–4 and also with FIG. 6, shows the schematic of the horizontal control logic. The horizontal control signals generated for the individual rows within sensor 5 are transfer gate $TX_i$, reset $RST_i$, and row select $ROW_i$. The voltage level of the $TX_i$ and $RST_i$ signals can be set independently of the rest of the logic circuits. To transfer charge accumulated beneath the pinned photodiode 402, the transfer gate 404 is clocked by $TX_i$ to transfer the signal charge to the floating diffusion node 406. The high and low levels for the transfer gate are set using the V⁻TX and V⁺TX inputs to the chip as shown in FIG. 5.

In a similar fashion the reset transistor 410 is driven by signal RSTi. The high and low levels for the reset transistor 410 are set using V-RST and V⁺RST inputs to the chip. Since these gate thresholds can be adjusted, different effects and tolerances can be obtained. This adjustable gate threshold, for example, may make it possible to adjust for charge capacity and antiblooming control tolerances, or provide special effects in the acquired image. Buffer circuit 504 and level shifting circuit 506 perform functions similar to the equivalent circuits, 304 and 306, previously discussed in FIG. 3.

In addition, the reset level of the floating diffusion node 406 can be set using the input RSTLVL to the chip, which forms the value VDD that is used as the reset.

The frame reset signal F-RST is an inverted signal (active low) that when low switches on the reset transistors of the entire array, setting the floating diffusion node to RSTLVL, but does not empty the signal charge in the pinned photodiode.

FIG. 6 shows a potential energy diagram of a cross-section of the pixel region 400 with the pinned photodiode 402, transfer gate 404, and floating diffusion 406. In addition, each pixel region 400 contains reset, source follower input, and row selection transistors which are not shown. Also shown is a potential energy diagram showing the collection of photo-generated electrons in the pinned photo diode region.

Figure 7:
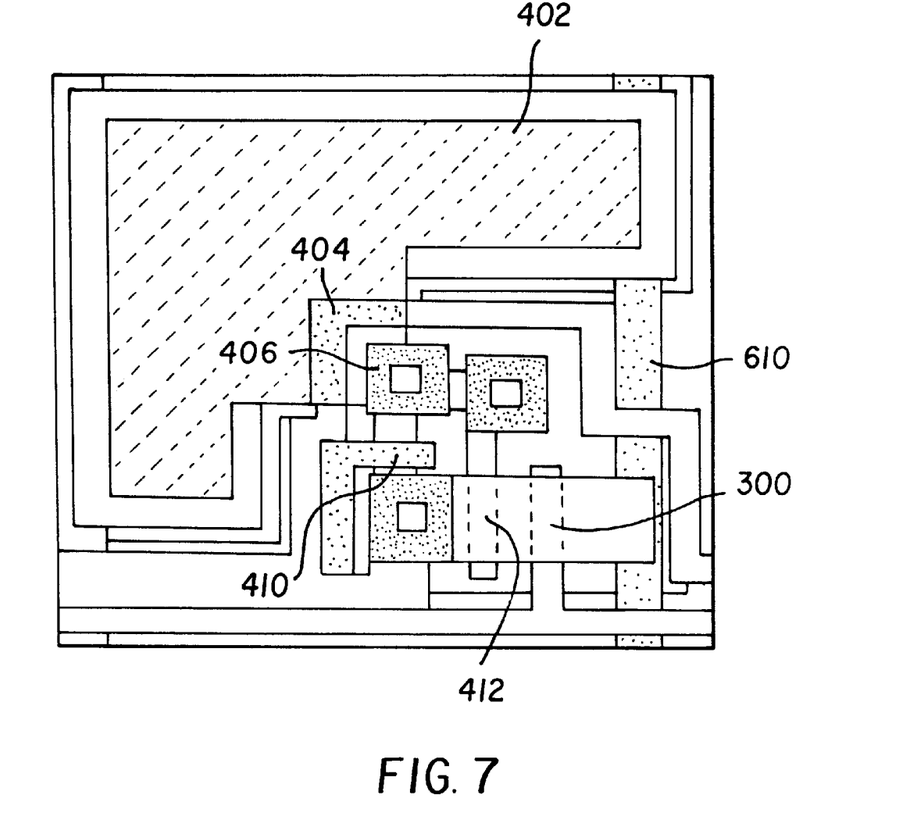
FIG. 7 shows a layout of the FIG. 6 schematic.

The layout of the pixel region 400, as shown in FIG. 7 and viewed in conjunction with FIG. 6, has a pixel size of 40 $\mu$m×40. This pixel size is for the preferred embodiment disclosed, herein. It should be readily apparent to those skilled in the art that other pixel sizes and configurations may equally apply the concepts of the present invention. The pixel overlaps the poly2 reset signal line with the poly1 row selection line to maximize the optical fill factor. The L-shaped pinned photodiode region 402 is used to maximize the photoactive area. The resultant optical fill factor is approximately 30%.

Anti-blooming is achieved by setting the transfer gate 404 and reset transistor 410 to a low level of 2.5 V to act as a lateral anti-blooming drain. A buried channel transfer gate is used to allow for complete charge transfer from the photodiode with a transfer gate high level of 5 V.

The reset gate low level is set to 1.25 V so that charge levels beyond this point will bleed off into the charge sink 606 (as shown in FIG. 6), which is biased at VDD. Hence, this acts as a lateral antiblooming drain. A buried channel transfer gate 404 is used to allow for complete charge transfer from the pinned photodiode 402 with a transfer gate high level of 5 V. A threshold adjustment may be used to facilitate in charge transfer to the floating diffusion.

The array is preferably read out one row at a time. The transfer gate 404 transfers a row at a time. Each pinned photodiode 402, in the row being transferred, transfers its stored charge to its respective floating diffusion 406. The reset and signal level from each pixel in the selected row are loaded to sample and hold capacitors at the bottom of each column. The column selection transistors 300 provide that the data from each column is then read out serially as pixel signal out 610.

Figures 8, 9:
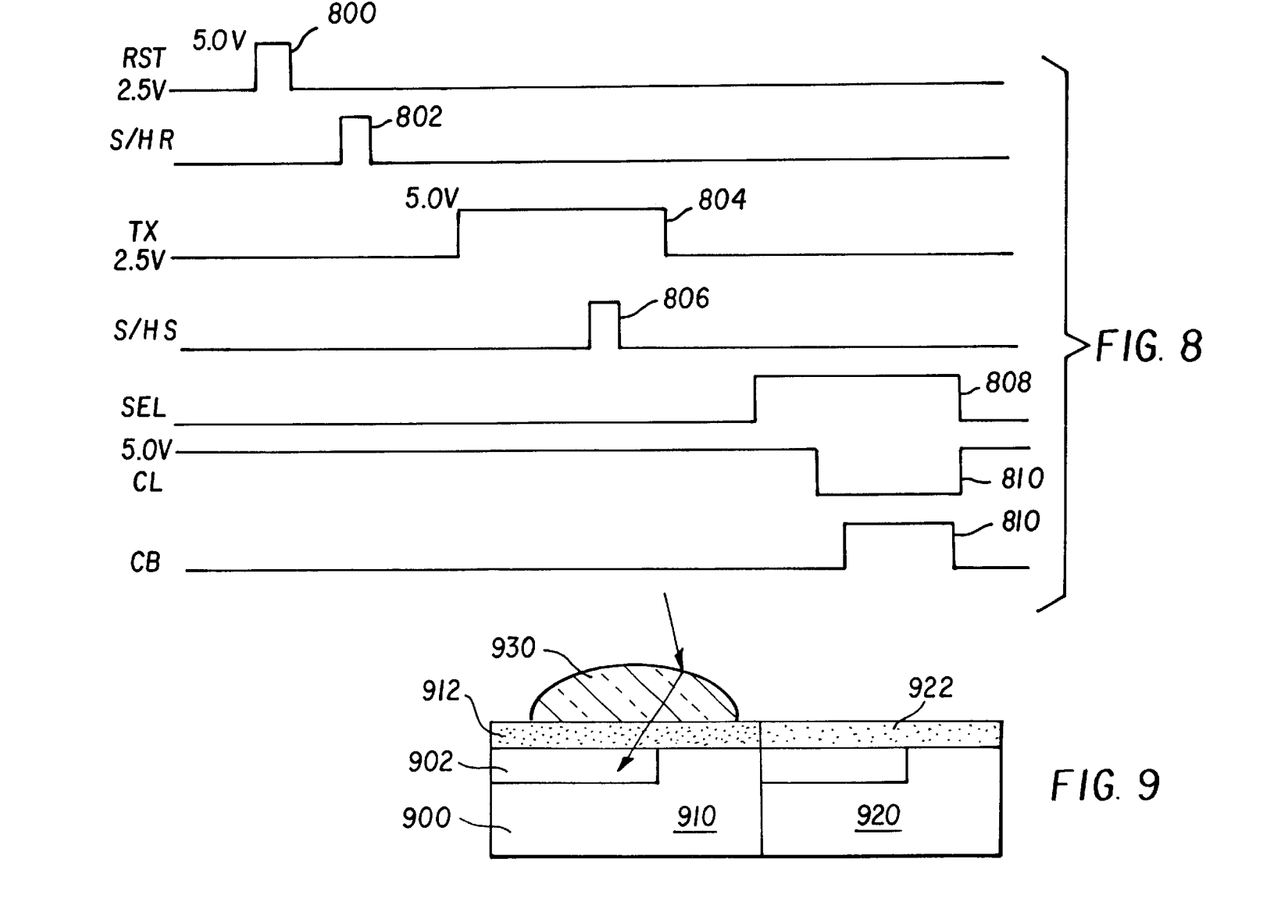
FIG. 8 shows a timing diagram of the operation.
FIG. 9 shows a layer level diagram of the chip showing the layers including the lens and color filter array layers.

The resultant voltage level timing diagram is shown in FIG. 8. Preferably, all clocks run at TTL levels. The high voltage level of the transfer gate may need to be shifted to achieve complete transfer of signal charge from the pinned photodiode 402 to the floating diffusion node 406.

Now referring to FIG. 8 in conjunction with FIG. 4, the operation proceeds as follows:

First, the reset transistor 410 is switched on at 800, setting the potential of the floating diffusion node 406 to VDD; in this embodiment, approximately 3.5 V.

After the reset transistor 410 has completed its switching, the reset sample and hold transistor 430 is switched on at 802, storing the reset level of each pixel on the associated reset level sample and hold capacitor bank 432.

Time 804 represents the end of the photo integration period. Transfer gate 404 is pulsed to transfer the signal charge from the pinned photodiode 402 to the floating diffusion node 406.

The signal sample and hold transistor 434 is switched on at 806 to store the signal level of each pixel on the signal level sample and hold capacitor bank 430/432.

The column is then read out at 808 by switching on the clamping transistors 442, 450 and storing the signal sample and reset levels of that column across the AC coupling sampling and reset capacitors 444, 446.

Next, the clamped reset voltage is turned off, and the "crowbar" switch 428 is turned on at 810. The clamped reset voltage Vcl, is controlled by lowering the voltage CL that drives the clamping transistors 442 and 450. When crowbar switch 428 is turned on, the inputs to the p-channel source-followers are shorted together. This averages the charge and also captures the offset in the p-channel source followers in the column being read out.

The final output signal is the signal level subtracted from the reset level.

Switching on the "crowbar" switch in the output circuitry suppresses the offset in the p-channel column source-follower. The clamped reset and AC coupling capacitors subtract out the offset from the p-channel source-follower and minimizes the fixed pattern noise contribution.

FIG. 9 shows a layer diagram illustrating the substance 900, with photodiode area 902. Two pixels, 910 and 920, are shown. Pixel 910 is covered by a color filter layer 912 that passes only a single color of light. Pixel 920 is covered by a different color filter 922. In this way adjacent pixels receive information indicative of the light content of different colors. Each pixel is preferably covered by microlens 930, which refracts at least a portion of the incoming light to the photodiode area 902.

The invention has been described with reference to a preferred embodiment; However, it will be appreciated that variations and modifications can be effected by a person of ordinary skill in the art without departing from the scope of the invention.

PARTS LIST:

5 sensor
10 pixel array
12 row decoder
14 column signal processing 16 column addressing decoder
22 individual row control circuits
24 individual column control
100 8-input nand gate
110 nand gate input
111 nand gate input
112 nand gate input
113 nand gate input
114 nand gate input
115 nand gate input
116 nand gate input
117 nand gate input
120 diffusion
122 diffusion
300 column selection transistors
302 inactivity signal
304 buffer circuit
306 level shifting and gate
400 pixel region
402 pinned photodiode
404 transfer gate
405 column circuitry
406 floating diffusion
410 reset transistor
412 source follower
414 row decode transistor
420 common chip region
422 stacked capacitors (cs)
424 mos capacitor
426 poly1-poly2 capacitor
428 crowbar switch(cb)
430 sample and hold reset transistor
432 reset capacitor bank
434 sample and hold transistor
442 clamping transistor
444 sample capacitance (cos)
446 rest capacitance (cor)
450 clamping transistor
504 buffer circuit
506 level shifting and gate circuit
606 charge sink
610 pixel signal out
800 switch on period
802 sample and hold switch on
804 end of the photo integration period
806 signal sample and hold transistor on
808 selection transistors on
810 crowbar switch on
900 substance
902 photodiode area
910 pixel
912 color filter layer
920 pixel
922 color filter layer
930 microlens
SEL global select
RSTLVL reset level
SEL $_j$ column select
SF source follower transistor
V+positive power supply
V−negative power supply

We claim:

1. An active pixel sensor comprising:
a substrate having an area divided into a plurality of pixel areas arranged in a series of rows and columns, having at least one control area separate from the pixel areas;
a pinned photodiode formed in at least one of the pixel areas of the substrate;
a readout transistor integrated on the pixel area of the substrate and operatively coupled to the pinned photodiode through a transfer gate and a charge to voltage conversion means;
at least one row selection circuit integrated on the substrate that is capable of selecting one row of the pixel areas, the row selection circuit further comprising a boolean AND (NAND) function activated by a binary address indicative of the row in which the pixel resides, the NAND function being coupled to a OR (NOR) function, wherein the row selection circuit further includes a series of transistors forming the boolean AND (NAND) function implemented using overlaid levels 1 and 2 polysilicon gates;
a level shifting circuit having coupled to the OR(NOR) function output;
a column selection circuit capable of selecting a group of pixels formed within the substrate in one of the control areas separate from the pixel areas, the column selection circuit further comprising a column readout circuit allocated for each of the columns including a double delta sampling circuit formed from a process that is compatible with CMOS technology; and
a reset circuit.

2. The sensor of claim 1 wherein the row selection circuit further comprises a series of transistors forming the boolean AND (NAND) function implemented using overlaid polysilicon levels 1 and 2 gates.

3. The sensor of claim 1 wherein the column selection circuit further comprises at least one column selection circuit implemented with at least one stacked capacitor comprising:
a MOS capacitor underneath a poly1-poly2 capacitor; and
a crowbar switch incorporated into the column selection circuit.

4. The sensor of claim 1 wherein the transfer gate off voltage level controls blooming levels.

5. The sensor of claim 1 wherein the transfer gate on voltage (V+TX) setting completes charge transfer of the pinned photodiode.

6. A sensor as in claim 4 wherein the reset level is controlled by a reset drain voltage control signal.

7. A sensor as in claim 1 wherein pixel overlaps the poly-2 reset signal line with the poly-2 row selection line to maximize the optical fill factor.

8. An active pixel sensor, comprising:
a substrate having a plurality of pixel areas arranged in rows and columns, and at least one control area such that the control area is associated with at least one pixel.
a pixel selection circuit having at least one row selection circuit integrated on the substrate capable of selecting one row of pixels, the row selection circuit further comprising a boolean AND (NAND) functioon activated by a binary address indicative of the row in which the pixel resides, the NAND function being coupled to a OR (NOR) function, wherein the row selection circuit further comprises a series of transistors forming the boolean AND (NAND) function implemented using overlaid levels 1 and 2 polysilicon gates;
a level shifting circuit having coupled to the OR (NOR) function output;
at least one pixel area comprising:
a) an optically active area including a printed photodiode, integrated on the substrate in the pixel area, and functioning to accumulate an indication of incoming photons therein; and b) an optically inactive area, including at least one readout transistor integrated on the substrate in the pixel area and operatively coupled to the pinned photodiode through a transfer gate;

the readout transistor being formed of a formation process that is compatible with CMOS technology; and a plurality of correlated double sampling units within the pixel selection circuitry allocated such that there is a correlated double sampling unit for each of the columns.

9. A sensor as in claim 8, wherein the pixel selection circuitry includes a plurality of transistors formed into a logical gate arrangement, the transistors having controlling gates overlapping other of the gates, the logical gates used for column addressing.

10. A sensor as in claim 8 wherein the transistors in the pixel area have at least one overlapping gate.

11. An active pixel sensor, comprising:

a substrate having an area, the area functionally divided to form a plurality of pixel areas arranged in rows and columns;

a pixel selection circuit having at least one row selection circuit integrated on the substrate capable of selecting one row of pixels, the row selection circuit further comprising a boolean AND (NAND) function activated by a binary address indicative of the row in which the pixel resides, the NAND function being coupled to a OR (NOR) function, wherein the row selection circuit further comprises a series of transistors forming the boolean AND (NAND) function implemented using overlaid levels 1 and 2 polysilicon gates;

a level shifting circuit having coupled to the OR (NOR) function output;

each of the pixel areas comprising:
a) a light information receiving element, integrated on the substrate in the pixel area, and functioning to accumulate an indication of incoming light therein; and b) control electronics, including at least one readout transistor element integrated on the substrate in the pixel area;

the readout transistor element being formed of a formation process that is compatible with CMOS technology; and pixel selection circuitry elements, including a plurality of transistors having controlling gates, wherein at least one of the elements including gates on the substrate overlapping another of the gates on the substrate; and a correlated double unit allocated for each of the columns outside the pixel area.

12. An active sensor as in claim 11, wherein the pixel selection circuitry elements include a plurality of transistors in series, at least one of the gates of one of the transistors having a part which overlaps at least a part of another gate of another transistor.

13. An active sensor as in claim 11, wherein the pixel selection circuitry elements include a plurality of transistors in series, at least a first gate of a first of the transistors having a first part which overlaps at least a part of a second gate of a second transistor, and having a second part which overlaps at least a part of a third gate of a third transistor.

14. An active sensor as in claim 11, wherein the light information receiving element is a pinned photodiode.

15. An active sensor, comprising:

substrate;

at least one pixel area, formed in the substrate, and comprising:
a) a light information receiving element, integrated on the substrate and functioning to accumulate an indication of incoming photons therein; and b) a control area, including at least one readout transistor element integrated on the substrate in the pixel area;

wherein at least a portion of the light information receiving element overlapping and covering at least a portion of the control area;

the light information receiving element formed of a formation process usually used for CCDs, and the readout transistor element being formed of a foundation process that is compatible with CMOS technology;

a pixel selection circuit having at least one row selection circuit integrated on the substrate capable of selecting one row of pixels, the row selection circuit further comprising a boolean AND (NAND) function activated by a binary address indicative of the row in which the pixel resides, the NAND function being coupled to a OR (NOR) function, wherein the row selection circuit further comprises a series of transistors forming the boolean AND (NAND) function implemented using overlaid levels 1 and 2 polysilicon gates;

a level shifting circuit having coupled to the OR (NOR) function output; and a correlated double sampling unit allocated for each column.

16. An active sensor as in claim 15 wherein the control area further includes a signal line including a control signal thereon, and wherein the light information receiving element covers at least a portion of the signal line.

17. An active sensor as in claim 16 wherein the signal line is a reset line.

18. An active sensor as in claim 17, wherein at least one of the elements includes a gate on the substrate overlapping another of the gates on the substrate.

19. An active sensor as in claim 15 wherein the light information receiving element is a pinned photodiode.

20. An active sensor, comprising:

a substrate having an area, the area being functionally divided to form a plurality of pixel areas arranged in rows and columns, and at least one control area;

each of the pixel areas comprising:
a) a light information receiving element employing a pinned photodiode integrated on the substrate in the pixel area, and functioning to accumulate an indication of incoming photons therein; and b) control electronics, including at least one readout transistor element integrated on the substrate in the pixel area, and at least one selection circuit, the selection circuit comprising a plurality of transistors located adjacent one another, and wherein the transistors having gates on the substrate, at least one of the gates on the substrate overlapping another of the gates on the substrate;

the readout transistor element being formed of a formation process that is compatible with CMOS technology;

pixel selection circuitry elements, in the control area including a plurality of transistors having controlling gates, wherein at least one of the elements including gates on the substrate overlapping another of the gates on the substrate, and a pixel selection circuit having at least one row selection circuit integrated on the substrate capable of selecting one row of pixels, the row selection circuit further comprising a boolean AND (NAND) function activated by a binary address indicative of the row in which the pixel resides, the NAND function being coupled to a OR (NOR) function, wherein the row selection circuit further comprises a series of transistors forming the boolean AND (NAND) function implemented using overlaid levels 1 and 2 polysilicon gates;

a level shifting circuit having coupled to the OR (NOR) function output; and a correlated double sampling unit allocated for each of the columns.

21. A mixed technology active pixel sensor, comprising:

a substrate having an area, the area functionally divided to form a plurality of pixel areas arranged in rows and columns, and at least one control area separate from the pixel areas;

a photodiode element integrated on the substrate in the pixel area, and functioning to accumulate an indication of incoming photons therein;

at least one readout transistor integrated on the substrate in the pixel area;

at least one selection transistor, integrated on the substrate in the pixel area to operate in selecting the pixel;

the readout transistor, and the selection transistor being formed of a formation process that is compatible with CMOS technology;

a pixel selection circuit having at least one row selection circuit integrated on the substrate capable of selecting one row of pixels, the row selection circuit further comprising a boolean AND (NAND) function activated by a binary address indicative of the row in which the pixel resides, the NAND function being coupled to a OR (NOR) function, wherein the row selection circuit further comprises a series of transistors forming the boolean AND (NAND) function implemented using overlaid levels 1 and 2 polysilicon gates;

a level shifting circuit having coupled to the OR (NOR) function output; and a column readout circuit formed in the control area including a double delta sampling circuit formed for each of the columns from a process that is compatible with CMOS technology.

22. An active pixel sensor that provides correlated double sampling comprising:

a substrate having an area functionally divided to form a plurality of pixels in a series of columns and rows, and at least one control area outside the area;

a light information receiving element, integrated on the substrate in the pixel area functioning to accumulate an indication of incoming photons therein, coupled to a transfer gate having clocking means to adjust the voltage of the transfer gate; and at least one readout transistor element integrated on the substrate in the pixel area, and at least one selection circuit, the selection circuit comprising a plurality of transistors located adjacent one another, a sensing node, a switch, selectively operating to connect the sensing node to the readout transistor element, and a reset switch, operating to connect the sensing node to a reset level;

a column readout circuit including a double delta sampling circuit formed from a process that is compatible with CMOS technology;

pixel selection circuitry elements, including a plurality of transistors having controlling gates and a pixel selection circuit having at least one row selection circuit integrated on the substrate capable of selecting one row of pixels, the row selection circuit further comprising a boolean AND (NAND) function activated by a binary address indicative of the row in which the pixel resides, the NAND function being coupled to a OR (NOR) function, wherein the row selection circuit further comprises a series of transistors forming the boolean AND (NAND) function implemented using overlaid levels 1 and 2 polysilicon gates; and a level shifting circuit having coupled to the OR (NOR) function output.

23. The sensor of claim 22 further comprising at least a first and a second chip input supplying a non-reset voltage, and a reset voltage to the control electronics.

24. A sensor as in claim 23, wherein at least one of the elements including gates on the substrate overlapping another of the gates on the substrate.

* * * * *

UNITED STATES PATENT AND TRADEMARK OFFICE
CERTIFICATE OF CORRECTION

PATENT NO.   : 6,320,617 B1
DATED        : November 20, 2001
INVENTOR(S)  : Russell C. Gee et al.

It is certified that error appears in the above-identified patent and that said Letters Patent is hereby corrected as shown below:

<u>Title page,</u>
Item [73], Assignee, after "Eastman Kodak Company, Rochester, N.Y." insert
-- California Institute of Technology, Pasadena, CA --

<u>Column 1,</u>
Line 3, insert -- The invention described herein was made in the performance of work under a NASA contract, and is subject to the provisions of Public Law 96-517 (35 U.S.C. 202) in which the Contractor has elected to retain title. --

Signed and Sealed this

Seventeenth Day of June, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,320,617 B1
DATED : November 20, 2001
INVENTOR(S) : Russell C. Gee et al.

It is certified that error appears in the above-identified patent and that said Letters Patent is hereby corrected as shown below:

Column 8,
Line 66, replace the word "printed" with the word -- pinned --.

Column 10,
Line 2, before the word "substrate", insert -- a --.
Line 17, replace the word "foundation" with the word -- formation --.

Signed and Sealed this

Nineteenth Day of August, 2003

JAMES E. ROGAN
*Director of the United States Patent and Trademark Office*